United States Patent [19]

Yokogawa

[11] Patent Number: 4,513,242

[45] Date of Patent: Apr. 23, 1985

[54] ELECTRONIC IMPEDANCE SERVICE FOR PROVIDING A VARIABLE IMPEDANCE

[75] Inventor: Fumihiko Yokogawa, Tokorozawa, Japan

[73] Assignee: Pioneer Electronic Corporation, Tokyo, Japan

[21] Appl. No.: 429,316

[22] Filed: Sep. 30, 1982

[30] Foreign Application Priority Data

Oct. 1, 1981 [JP] Japan .................... 56-156396

[51] Int. Cl.³ ............................................ H03H 11/00
[52] U.S. Cl. .................................. 323/352; 307/264; 333/14; 381/94
[58] Field of Search ............... 323/352, 364; 381/7, 381/13, 94; 333/14; 307/264

[56] References Cited

U.S. PATENT DOCUMENTS

| 4,066,914 | 1/1978 | Gundry | 307/264 |
| 4,220,875 | 9/1980 | Lawton | 333/14 |
| 4,288,707 | 9/1981 | Katakura | 307/264 |
| 4,339,677 | 7/1982 | Hoeft | 307/264 |

Primary Examiner—William H. Beha, Jr.
Attorney, Agent, or Firm—Fleit, Jacobson, Cohn & Price

[57] ABSTRACT

An electronic impedance device provides a variable impedance in, for example, a Dolby noise reduction system. The device includes an input terminal connected to a source of a signal voltage. A differential voltage-to-current converter circuit, having a relatively high input impedance, converts the input signal voltage into two differential output currents that are variable with the input signal voltage. A pair of p-n junction elements, such as diodes, are connected to the converter circuit via a current transfer circuit. The current transfer circuit transfers the differential output currents to the p-n junction elements. A differential current amplifier circuit is responsive to the voltage built up across the p-n junction elements. The differential current amplifier has an output terminal to produce an output current. A feedback line connects the output terminal of the amplifier circuit to the input terminal for permitting the output current of the amplifier circuit to be fed back to the input terminal of the device.

10 Claims, 4 Drawing Figures

ELECTRONIC IMPEDANCE DEVICE FOR PROVIDING A VARIABLE IMPEDANCE

FIELD OF THE INVENTION

The present invention relates to an electronic impedance device and, more particularly, to an electronic impedance device adapted to provide a variable impedance.

BACKGROUND OF THE INVENTION

An electronic impedance device conventionally used in, for example, a Dolby noise reduction system of a magnetic-tape audio and/or video reading and reproducing apparatus has a drawback in that the device is required to operate on relatively high voltages to compensate for the voltage drops caused across the p-n junctions in the semiconductor elements such as the transistors and diodes. Such an impedance device is not adapted for integration of the semiconductor circuit. The present invention contemplates provision of an electronic impedance device operable on reduced voltages.

SUMMARY OF THE INVENTION

In accordance with the present invention, there is provided an electronic impedance device, comprising an input terminal to be connected to a source of a signal voltage; differential voltage-to-current converting means having a relatively high input impedance and operative to convert the signal voltage into two differential output currents variable with the signal voltage; a pair of p-n junction elements connected to the voltage-to-current converting means; current transfer means intervening between the voltage-to-current converting means and the p-n junction elements, respectively, and operative to transfer the differential output currents to the p-n junction elements; a differential current amplifier circuit which is responsive to voltages built up respectively across the p-n junction elements and which has an output terminal at which the amplifier circuit is to produce its output current; and feedback means providing connection from the output terminal of the amplifier circuit to the aforesaid input terminal for permitting the output current of the amplifier circuit to be fed back to the input terminal. An electronic impedance device thus constructed and arranged in accordance with the present invention may further comprise a pair of current sources respectively connected to the p-n junction elements. The current transfer means may comprise a pair of current mirror networks connected between the voltage-to-current converting means and the p-n junction elements, respectively, or two pairs of current mirror networks, each pair of current mirror networks being connected between the voltage-to-current converting means and each of the p-n junction elements, one of each pair of current mirror networks having included therein a switch having open and closed positions.

BRIEF DESCRIPTION OF THE DRAWINGS

The drawbacks of a prior-art electronic impedance device and the features and advantages of an electronic impedance device according to the present invention will be more clearly understood from the following description taken in conjunction with the accompanying drawings in which like reference numerals designate similar or corresponding units and elements and in which.

DESCRIPTION OF THE PRIOR ART

Figure 1:
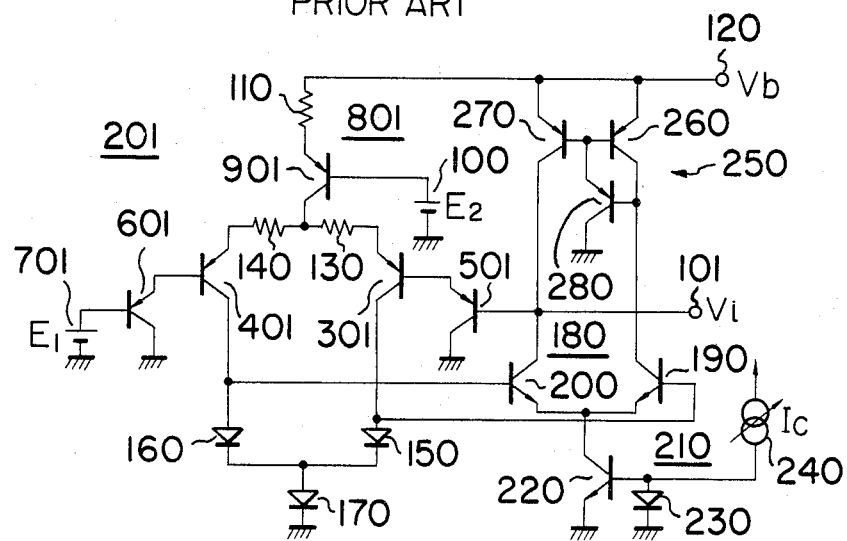
FIG. 1 is a circuit diagram showing a representative example of a prior-art electronic impedance device.

In FIG. 1 of the drawings, is shown the circuit arrangement of an example of a prior-art electronic impedance device. The electronic impedance device herein shown is intended for incorporation in a Dolby noise reduction system of a magnetic-tape audio and/or video recording apparatus. In such a noise reduction system, a variable electronic impedance device is used so that the extension and compression characteristics of the levels of the signals to be recorded and reproduced can be varied minutely. The electronic impedance device comprises an input terminal 101 through which a signal voltage Vi is to be supplied to the impedance device, and a differential voltage-to-current converter circuit 201 which is adapted to convert the signal voltage Vi into two differential output currents continuously variable with the input voltage Vi. The voltage-to-current converter circuit 201 comprises a differential amplifier consisting basically of first and second differential transistors 301 and 401. The first differential transistor 301 has its base connected to the emitter of a first emitter-follower transistor 501 which has its base connected to the input terminal 101 of the impedance device. On the other hand, the second differential transistor 401 has its base connected to the emitter of a second emitter-follower transistor 601 which has its base connected to a source 701 of a predetermined reference voltage $E_1$. The differential amplifier thus composed of the transistors 301 and 401 is supplied with an operating current from a current supply network 801 which comprises a transistor 901 having its base connected to a source 100 of a predetermined bias voltage $E_2$ and its emitter connected through a resistor 110 to a source 120 of a predetermined positive voltage Vb. The transistor 901 has its collected connected through resistors 130 and 140 to the emitters of the differential transistors 301 and 401 so that a constant current is supplied from the source 120 by way of the resistor 110 and the transistor 901 and such current is fed through the resistors 130 and 140 to the emitters of the transistors 301 and 401, respectively. The changes in the output currents from the voltage-to-current converter circuit 201, viz., the currents respectively appearing at the collectors of the transistors 301 and 401 of the converter circuit 201 are detected by forwardly biased first and second diodes 150 and 160, respectively. The first and second diodes 150 and 160 have their anode terminals connected to the collectors of the transistors 301 and 401, respectively, and their cathode terminals connected are grounded through a third diode 170. The diodes 150 and 160 operate within the range in which the current-voltage characteristics thereof vary exponentially. Each of the transistors 301, 401, 501, 601 and 901 above described is of the p-n-p junction type.

The prior-art electronic impedance device shown in FIG. 1 further comprises a current amplifier circuit 180 adapted to amplify the differential output currents delivered from the voltage-to-current converter circuit 201. The current amplifier circuit 180 comprises n-p-n junction first and second differential transistors 190 and 200 which have their bases connected to the collectors of the first and second differential transistors 301 and 401, respectively, of the voltage-to-current converter circuit 201 so that voltages which vary with the currents to flow from the collectors of the transistors 301 and 401 to the first and second diodes 150 and 160, respectively, are supplied to the bases of the differential transistors 190 and 200, respectively. Each of the transistors 190 and 200 is of the n-p-n junction type. The current amplifier circuit 180 is supplied with an input current $I_1$ from a current supply network 210 which comprises an n-p-n junction transistor 220 having its collector connected to the respective emitters of the differential transistors 190 and 200 and its base connected in parallel with a diode 230 to a source 240 of a control current Ic. The current amplifier circuit 180 thus constructed and arranged is loaded by a current mirror network 250 which consists of p-n-p junction transistors 260 and 270 having their respective emitters jointly connected in parallel to the constant voltage source 120 and their collectors connected to the collectors of the first and second differential transistors 190 and 200, respectively, of the amplifier circuit 180, and a p-n-p junction transistor 280 having its emitter connected to the respective bases of the transistors 260 and 270 and its base connected to the respective collectors of the transistors 190 and 260 as shown. The second differential transistor 200 of the current amplifier circuit 180 has its collector connected not only to the collector of the transistor 270 but to the base of the first emitter-follower transistor 501 of the voltage-to-current converter circuit 201 and is thus operative to feed back an output current from its collector to the base of the transistor 501, viz., to the input terminal 101 of the impedance device.

The voltage-to-current converter circuit 201 of the electronic impedance device constructed and arranged as above described has an input impedance which is so high that, in the presence of the signal voltage Vi at the input terminal 101 of the impedance device, the output current, denoted by $I_2$, of the current amplifier circuit 180 can be regarded as equal to the current Ii appearing at the input terminal 101 so that $$I_2 = Ii.  \qquad \text{Eq. 1}$$

The gain of the current amplifier circuit 180 is proportional to the control current Ic supplied from the control current source 240 and is given by $$I_2/I_1 = k \cdot Ic. \qquad \text{Eq. 2}$$

where k is a constant. If, thus, the transfer conductance of the voltage-to-current converter circuit 201 is denoted by Gm, the input current $I_1$ of the current amplifier circuit 180 is expressed in the form of $$I_1 = Gm \cdot Vi. \qquad \text{Eq. 3}$$

From Eqs. 1, 2 and 3, the input impedance, Zi, of the whole circuit is given by $$Zi = Vi/I_2 = 1/(k \cdot GM \cdot Ic). \qquad \text{Eq. 4}$$

It will be evident from Eq. 4 that the input impedance Zi of the whole circuit varies markedly with the control current Ic appearing at the input terminal of the current amplifier circuit 180. A problem is however encountered in such an electronic impedance device in that a source of an operating voltage higher than about 3.5 volts, viz., five times the forward voltage (usually about 0.7 volt for a silicon transistor) to be built up across a p-n junction between, for example, the base and emitter of each of the transistors 301, 501, 901, 200 and 220 and a p-n junction of the diode 230 (which is usually constituted by a transistor) is required in the circuit arrangement so as to compensate for a voltage drop across such a p-n junction. If, on the other hand, the whole circuit of the impedance device is to be integrated, it is desirable that the circuit be constructed and arranged in such a manner as to be operable at voltages which are as low as possible. The circuit arrangement of the prior-art electronic impedance device described with reference to FIG. 1 is not fully acceptable for this purpose.

It is, accordingly, an important object of the present invention to provide an improved electronic impedance device which is adapted to operate at satisfactorily reduced voltages.

DESCRIPTION OF THE PREFERRED EMBODIMENTS

Figure 2:
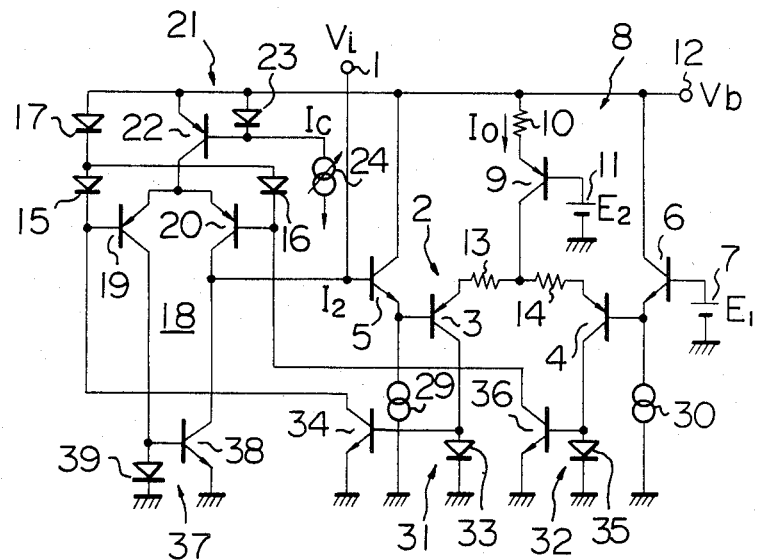
FIG. 2 is a circuit diagram showing a preferred embodiment of an electronic impedance device according to the present invention.

Referring to FIG. 2 of the drawings, an electronic impedance device embodying the present invention comprises an input terminal 1 through which a signal voltage Vi is to be supplied to the whole circuit of the impedance device, and a differential voltage-to-current converter circuit 2 having a relatively high input impedance and adapted to convert the signal voltage Vi supplied to the input terminal 1 into two differential output currents which are continuously variable with the input voltage Vi. The voltage-to-current converter circuit 2 is constituted by a differential amplifier which consists essentially of first and second differential transistors 3 and 4 each of which is of the p-n-p junction type, similarly to the prior-art impedance device described with reference to FIG. 1. The first differential transistor 3 has its base connected to the emitter of a first emitter-follower transistor 5 which has its base connected to the input terminal 1 of the impedance device. On the other hand, the second differential transistor 4 has its base connected to the emitter of a second emitter-follower transistor 6 which has its base connected to a source 7 of a predetermined reference voltage $E_1$. The first and second emitter-follower transistors 5 and 6 are operative to deliver outputs from their respective emitters to the bases of the first and second differential transistors 3 and 4, respectively. The emitter-follower transistors 5 and 6 are of the n-p-n junction type and are adapted to increase the input impedance of the voltage-to-current converter circuit 2. The differential amplifier composed of the transistors 3 and 4 is supplied with an operating current from a current supply network 8 which comprises a p-n-p junction transistor 9 having its base connected to a source 11 of a predetermined bias voltage $E_2$ and its emitter connected through a resistor 10 to a constant voltage source 12 of a predetermined positive voltage Vb. The transistor 9 has its collector connected through resistors 13 and 14 to the emitters of the first and second differential transistors 3 and 4 so that a constant current is supplied from the source 12 by way of the resistor 10 and the transistor 9, and such current is fed through the resistors 13 and 14 to the emitters of the first and second differential transistors 3 and 4, respectively. The first and second emitter-follower transistors 5 and 6 have their respective collectors connected in parallel to the constant voltage source 12 and are supplied with operating currents through current sources 29 and 30, respectively, which are connected each at one terminal to the emitters of the transistors 5 and 6 and grounded at the other terminals thereof. If a sufficiently high input impedance can be achieved in the voltage-to-current converter circuit 2, the emitter-follower transistors 5 and 6 and accordingly the current sources 29 and 30 may be dispensed with.

The first and second differential transistors 3 and 4 are connected through first and second current mirror networks 31 and 32 to suitable p-n junction elements which are respectively constituted by diodes 15 and 16. The first current mirror network 31 is composed of a diode 33 having its anode terminal connected to the collector of the first differential transistor 3 and its cathode terminal grounded, and an n-p-n transistor 34 having its base connected in parallel with the diode 33 to the collector of the first differential transistor 3 and its collector connected through the series combination of the diode 15 and a diode 17 to the constant voltage source 12. Similarly, the second current mirror network 32 is composed of a diode 35 having its anode terminal connected to the collector of the second differential transistor 4 and its cathode terminal grounded, and an n-p-n transistor 36 having its base connected in parallel with the diode 35 to the collector of the second differential transistor 4 and its collector connected through the series combination of the diodes 16 and 17 to the constant voltage source 12 as shown. The transistors 34 and 36 of the current mirror networks 31 and 32, respectively, further have their emitters grounded. The output currents from the collectors of the first and second differential transistors 3 and 4 are, thus, directed through the current mirror networks 31 and 32 to the diodes 15 and 16, respectively, and are thereby inverted in polarity. Thus, the first and second current mirror networks 31 and 32 serve as current transfer means intervening between the voltage-to-current converter circuit 2 and the diodes 15 and 16 constituting the p-n junction elements in an impedance device according to the present invention and are operative to transfer the differential output currents of the converter circuit 2 to the p-n junction elements. The diodes 15 and 16 have their respective anode terminals jointly connected to the constant voltage source 12 through the diode 17 and are biased in forward direction by the diode 17.

The electronic impedance device embodying the present invention further comprises a current amplifier circuit 18 responsive to the voltages built up respectively across the diodes 15 and 16 and operative to amplify the differential output currents from the voltage-to-current converter circuit 2 depending the voltages across the diodes 15 and 16. The current amplifier circuit 18 basically consists of first and second differential transistors 19 and 20 which have their bases connected to the constant voltage source 12 through the diodes 15 and 16, respectively, and the diode 17. Thus, voltages which vary with the currents flowing from the current mirror networks 31 and 32 to the diodes 15 and 16, respectively, are applied to the bases of the first and second differential transistors 19 and 20, respectively, of the amplifier circuit 18. Each of the transistors 19 and 20 is of the p-n-p junction type. The current amplifier circuit 18 is supplied with an operating current through a current supply network 21 which comprises a p-n-p junction transistor 22 having its emitter connected to the constant voltage source 12 and its collector connected to the respective emitters of the differential transistors 19 and 20, and a diode 23 having its anode terminal connected in parallel with the emitter of the transistor 22 to the constant voltage source 12 and its cathode terminal connected in parallel with the base of the transistor 22 to a source 24 of a control current Ic. The current amplifier circuit 18 thus constructed and arranged is loaded by a current mirror network 37 which comprises an p-n-p junction transistor 38 having its base connected to the collector of the transistor 19 of the amplifier circuit 18, its collector connected to the collector of the differential transistor 20 and its emitter grounded, and a diode 39 having its anode terminal connected in parallel with the base of the transistor 38 to the collector of the transistor 19 and its cathode terminal grounded. The second differential transistor 20 of the current amplifier circuit 18 has its collector connected not only to the collector of the transistor 38 but to the base of the first emitter-follower transistor 5 of the voltage-to-current converter circuit 2 and is operative to feed back an output current from its collector to the base of the transistor 5, viz., to the input terminal 1 of the impedance device. The interconnecting of the collector of the transistor 20 and the input terminal 1 of the impedance device constitutes feedback means providing connection from the output terminal of the amplifier circuit 18 to the input terminal and serves to feed back the output current of the amplifier circuit 18 to the input terminal 1.

In the electronic impedance device constructed as above described, the differential amplifier constituting the voltage-to-current converter circuit 2 is arranged in such a manner as to have double-ended output terminals so that the voltage-to-current converter circuit 2 has a mutual conductance $G_{m1}$ which is expressed in the form $$G_m1 = \frac{1}{Re + (kT/q)\cdot(Io/2)}, \qquad \text{Eq. 5}$$

where Re is the resistance value of each of the resistors 13 and 14, k is the Boltzmann constant, T is an absolute temperature, q is the electronic charge, and Io is the constant current which flows through the transistor 9 of the current supply network 8. If, furthermore, the first and second current mirror networks 31 and 32 are assumed to have an equal mirror ratio r, the current which flows through each of the diodes 15 and 16 is given as r(Io/2). It therefore follows that the resistance, denoted as Rd, which each of the diodes 15 and 16 exhibits to a signal current is expressed as
Ti $Rd=(kT/q)/r.(Io/2)$. Eq. 6

If the signal voltage at the input terminal 1 is denoted as Vi, then the signal voltage, denoted as Vd, across each of the diodes 15 and 16 is given by $$Vd = Vi.G_{m1}.Rd. \qquad \text{Eq. 7}$$

Considering Eqs. 5 and 6, Eq. 6 is re-written in the form $$Vd = Vi.(kT/q)[r.(Io/2).\{Re+(kT/q).(Io/2)\}] \qquad \text{Eq. 7'}$$

Because, on the other hand, of the fact that the differential amplifier in the current amplifier circuit 18 is loaded by the current mirror network 37, the transfer conductance, denoted as $G_{m2}$, of the differential amplifier is expressed as $$G_{m2} = 1/\{(kT/q)/(Ic/2)\}. \qquad \text{Eq. 8}$$

Hence, the output current, denoted by $I_2$, from the differential amplifier of the current amplifier circuit 18 is given as $$I_2 = G_{m2} \cdot Vd. \qquad \text{Eq. 9}$$

In consideration of Eqs. 7' and 8, Eq. 9 can be re-written in the form $$I_2 = Vi.(Ic/2)/\{r.(Io/2).\{Re+(kT/q).(Io/2)\}]. \qquad \text{Eq. 9'}$$

It therefore follows that the equivalent impedance $Zi$ of the whole circuit is given by $$\begin{aligned} Zi &= Vi/I_2 \qquad \text{Eq. 10} \\ &= r \cdot Io \cdot \{Re + (kT/q) \cdot (Io/2)\}/Ic. \end{aligned}$$

This means that the impedance $Zi$ of the electronic impedance device embodying the present invention is variable with the control current $Ic$ supplied to the device.

As will be understood from the foregoing description, the electronic impedance device embodying the present invention is operable reliably on voltages which are higher than only three times a forward voltage to be built up across the p-n junction in any of the transistors included in the component networks provided between the voltage source 12 and the ground level. As will be evident from Eq. 10, furthermore, the impedance $Zi$ of the whole circuit of the electronic impedance device embodying the present invention can be regulated by varying not only the control current $Ic$ but any one of the mirror ratio r of each of the current mirror networks 31 and 32 and the current $Io$ to be supplied to the differential amplifier constituting the voltage-to-current converter circuit 2.

Figure 3:
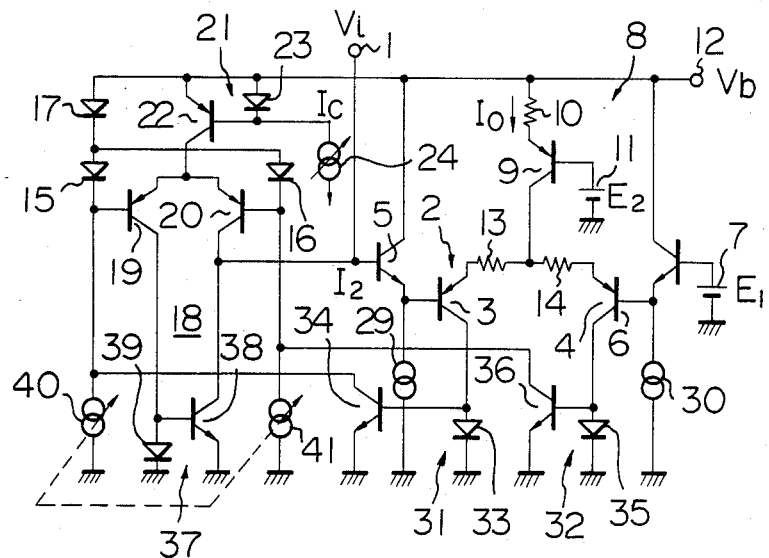
FIG. 3 is a circuit diagram showing a modification of the embodiment illustrated in FIG. 2.

FIG. 3 of the drawings shows a second preferred embodiment of an electronic impedance device according to the present invention. The embodiment herein shown is a modification of the embodiment hereinbefore described with reference to FIG. 2 and is characterized over the embodiment of FIG. 2 by the provision of current sources 40 and 41 adapted to supply currents $I_3$ and $I_4$ to the diodes 15 and 16, respectively, of the current amplifier circuit 18. The current source 40 is connected between the cathode terminal of the diode 15 and ground and, likewise, the current source 41 is connected between the cathode terminal of the diode 16 and ground. If the currents $I_3$ and $I_4$ to be supplied from these current sources 40 and 41 are equal to each other and assume a value $Ia$, the current to flow through each of the diodes 15 and 16 is given as $r.(Io/2)+Ia$. If, in this instance, $Ia$ is written in the form of $r'.Io$, then the current to flow through each of the diodes 15 and 16 is expressed as $$r.(Io/2)+Ia = Io.(r/2+r'). \qquad \text{Eq. 11}$$

Substitution of the right side of Eq. 11 into the term $r(Io/2)$ in Eq. 9' and further substitution of the resultant equation into Eq. 10 results in $Zi = Io.(r+2r').Re+($ Substitution of the right side of Eq. 11 into the term $r(Io/2)$ in Eq. 9' and further substitution of the resultant equation into Eq. 10 results in $$Zi = Io.(r+2r').Re+(kT/q).(Io/2)/Ic. \qquad \text{Eq. 12}$$

It will be seen from Eq. 12 that the impedance $Zi$ of the whole circuit of the embodiment shown in FIG. 3 can be regulated by varying not only the control current $Ic$, the current $Io$ to be supplied to the differential amplifier constituting the voltage-to-current converter circuit 2 and/or the mirror ratio r of each of the current mirror networks 31 and 32 but also the value of r', viz., the value $Ia$ of each of the currents $I_3$ and $I_4$ to be supplied from the current sources 40 and 41, respectively.

Figure 4:
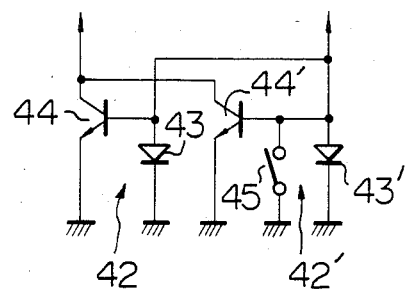
FIG. 4 is a circuit diagram showing a modification of a current mirror network incorporated in each of the embodiments illustrated in FIGS. 2 and 3.

FIG. 4 shows a modification of the current transfer means in each of the embodiments shown in FIGS. 2 and 3. The current transfer means shown in FIG. 4 comprises a parallel combination of first and second current mirror networks 42 and 42' which are connected in parallel between the voltage-to-current converter circuit 2 and the diodes 15 and 16, respectively. The first current mirror circuit 42 comprises a parallel combination of a diode 42 and an n-p-n transistor 44 and, likewise, the second current mirror network 42' comprises a parallel combination of a diode 43 and an n-p-n transistor 44'. In the case of the current mirror networks 42 and 42' to serve as as an alternative to the first current mirror network 31 in each of the embodiments of FIGS. 2 and 3, the diodes 43 and 43' have their anode terminals connected in parallel to the collector of the first differential transistor 3 of the voltage-to-current converter circuit 2 (FIGS. 2 and 3) and their cathode terminals connected to ground, and the transistors 44 and 44' have their bases connected in parallel with the diodes 43 and 43', respectively, to the collector of the first differential transistor 3 and their collectors connected in parallel with each other to the constant voltage source 12 through the series combination of the diodes 15 and 17 (FIGS. 2 and 3). In the case of the current mirror networks 42 and 42' which are to serve as an alternative to the second current mirror network 32 in each of the embodiments of FIGS. 2 and 3, the diodes 43 and 43' have their anode terminals connected in parallel to the collector of the second differential transistor 4 of the voltage-to-current converter circuit 2 (FIGS. 2 and 3) and their cathode terminals connected to ground, and the transistors 44 and 44' have their bases connected in parallel with the diodes 43 and 43', respectively, to the collector of the second differential transistor 4 and their collectors connected in parallel with each other to the constant voltage source 12 through the series combination of the diodes 16 and 17 (FIGS. 2 and 3). The emitters of the transistors 44 and 44' are grounded. One of the first and second current mirror networks such as the second current mirror network 42' as shown further comprises a switch 45 connected between the base of the transistor 44' and ground. The transistor 44' of the second current mirror network 42' is thus made conductive and non-conductive under the control of the switch 45 so as to control the output transfer current from the combination of the current mirror networks 42 and 42'. By substitution of each of the current mirror networks 31 and 32 in each of the embodiments of FIGS. 2 and 3 by the combination of the current mirror networks 42 and 42' constructed and arranged as above described, the mirror ratio r in each combination of the current mirror networks 42 and 42' and accordingly the impedance Zi of the whole circuit of the impedance device are made stepwise variable with the switch 45 selectively closed or made open.

It is to be understood that the switch 45 may be preferably constituted by an electronic switch element such as a transistor.

What is claimed is:

1. An electronic impedance device, comprising in combination an input terminal to be connected to a source of a signal voltage;
    differential voltage-to-current converting means having a relatively high input impedance and operative to convert said signal voltage into two differential output currents variable with the signal voltage;
    a pair of p-n junction elements connected to said voltage-to-current converting means;
    current transfer means comprising a pair of current mirror networks connected between said voltage-to-current converting means and said p-n junction elements, respectively, and operative to transfer said differential output currents to said p-n junction elements;
    a differential current amplifier circuit which is responsive to voltages built up respectively across said p-n junction elements and which has an output terminal at which the amplifier circuit is to produce its output current; and
    feedback means providing connection from the output terminal of said amplifier circuit to said input terminal for permitting the output current of the amplifier to be fed back to said input terminal.

2. An electronic impedance device as set forth in claim 1, further comprising a pair of current sources respectively connected to said p-n junction elements.

3. An electronic impedance device, comprising in combination an input terminal to be connected to a source of a signal voltage;
    differential voltage-to-current converting means having a relatively high input impedance and operative to convert said signal voltage into two differential output currents variable with the signal voltage;
    a pair of p-n junction elements connected to said voltage-to-current converting means;
    current transfer means intervening between said voltage-to-current converting means and said p-n junction elements, respectively, and operative to transfer said differential output currents to said p-n junction elements, in which said current transfer means comprises two pairs of current mirror networks, each pair of current mirror networks being connected between said voltage-to-current converting means and each of said p-n junction elements, one of each pair of current mirror networks having included therein a switch having open and closed positions;
    a differential current amplifier circuit which is responsive to voltages built up respectively across said p-n junction elements and which has an output terminal at which the amplifier circuit is to produce its output current; and
    feedback means providing connection from the output terminal of said amplifier circuit to said input terminal for permitting the output current of the amplifier circuit to be fed back to said input terminal.

4. An electronic impedance device, comprising in combination an input terminal to be connected to a source of a signal voltage;
    differential voltage-to-current converting means having a relatively high input impedance and operative to convert said signal voltage into two differential output currents variable with the signal voltage;
    a pair of p-n junction elements connected to said voltage-to-current converting means;
    current transfer means intervening between said voltage-to-current converting mens and said p-n junction elements, respecively, and operative to transfer said differential output currents to said p-n junction elements;
    a differential current amplifier circuit which is responsive to voltages built up respectively across said p-n junction elements and which has an output terminal at which the amplifier circuit is to produce its output current;
    feedback means providing connection from the output terminal of said amplifier circuit to said input terminal for permitting the output current of the amplifier circuit to be fed back to said input terminal; and
    wherein said voltage-to-current converting means comprises a pair of p-n-p junction differential transistors having their emitters jointly connected to a constant current source and their collectors connected to said p-n junction elements, respectively, through said current transfer means, and a pair of n-p-n junction emitter-follower transistors having their emitters connected to the bases of said differential transistors, respectively, their collectors connected to a source of constant voltage, the base of one said emitter-follower transistors being connected to the differential current amplifier circuit and to said input terminal through said feedback means and the base of the other emitter-follower transistor being connected to a constant voltage source.

5. An electronic impedance device as set forth in claim 4, in which said different current amplifier circuit comprises a pair of p-n-p differential transistors having their emitters jointly connected to said constant current source and their bases connected, in parallel with said p-n junction elements, to the collectors of the differential transistors, respectively, of the voltage-to-current converting means through said current transfer means, the collector of one of the differential transistors of the differential current amplifier circuit being connected to said input terminal and the base of one of said emitter-follower transistors through said feedback means.

6. An electronic impedance device as set forth in claim 5, in which said differential current amplifier circuit further comprises a current supply network comprising a transistor having its emitter connected to said source of the constant voltage, its collector connected to the emitters of the differential transistors of the differential current amplifier circuit, a diode having an anode terminal connected to the source of the constant voltage and its cathode terminal connected, in parallel with the base of the transistor of the current supply network, to a source of a control current.

7. An electronic impedance device as set forth in any one of claim 4 to 6, in which said p-n junction elements are constituted by diodes having their cathode terminals connected to said voltage-to-current converting means through said current transfer means.

8. An electronic impedance device as set forth in claim 7, further comprising a pair of current sources respectively connected to said p-n junction elements.

9. An electronic impedance device as set forth in claim 8, in which said current transfer means comprises a pair of current mirror networks connected between said voltage-to-current converting means and said p-n junction elements, respectively.

10. An electronic impedance device as set forth in claim 8, in which said current transfer means comprises two pairs of current mirror networks, each pair of current mirror networks being connected between said voltage-to-current converting means and each of said p-n junction elements, one of each pair of current mirror networks having included therein a switch having open and closed positions.

* * * * *